(12) United States Patent
Seto

(10) Patent No.: US 7,867,890 B2
(45) Date of Patent: Jan. 11, 2011

(54) MANUFACTURING METHOD OF SEMICONDUCTOR DEVICE AND SEMICONDUCTOR DEVICE

(75) Inventor: Masaru Seto, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 307 days.

(21) Appl. No.: 11/905,918

(22) Filed: Oct. 5, 2007

(65) Prior Publication Data
US 2008/0099876 A1 May 1, 2008

(30) Foreign Application Priority Data
Oct. 27, 2006 (JP) ............................. 2006-292782

(51) Int. Cl.
*H01L 21/4763* (2006.01)
(52) U.S. Cl. ........................ 438/622; 438/241; 438/624; 257/E21.573
(58) Field of Classification Search ............... 438/622, 438/624, 619, 761, E21.573, 241; 257/E21.581, 257/E21.573
See application file for complete search history.

(56) References Cited

U.S. PATENT DOCUMENTS

| | | | | |
|---|---|---|---|---|
| 5,323,343 A | * | 6/1994 | Ogoh et al. | 365/149 |
| 6,162,723 A | | 12/2000 | Tanaka et al. | |
| 6,300,242 B1 | * | 10/2001 | Ueda et al. | 438/638 |
| 6,690,084 B1 | * | 2/2004 | Mizuhara et al. | 257/650 |
| 6,914,318 B2 | * | 7/2005 | Lee et al. | 257/522 |

FOREIGN PATENT DOCUMENTS

| | | |
|---|---|---|
| JP | 08-213392 | 8/1996 |
| JP | 10-012730 | 1/1998 |
| JP | 2000-091431 | 3/2000 |

* cited by examiner

*Primary Examiner*—Michael Trinh
(74) *Attorney, Agent, or Firm*—Rabin & Berdo, PC

(57) ABSTRACT

The present invention provides a method of manufacturing a semiconductor device, which comprises steps of forming a plurality of wirings on a first insulating film formed on a semiconductor substrate so as to adjoin one another, forming a second insulating film on the first insulating film by a plasma CVD method and covering the wirings with the second insulating film in such a manner that air gaps are formed between the respective adjacent wirings, forming a third insulating film on the second insulating film by a high density plasma CVD method, and forming a fourth insulating film high in moisture resistance on the third insulating film.

14 Claims, 3 Drawing Sheets

MANUFACTURING METHOD OF SEMICONDUCTOR DEVICE AND SEMICONDUCTOR DEVICE

BACKGROUND OF THE INVENTION

The present invention relates to a method for manufacturing a semiconductor device, and particularly to a method for manufacturing a semiconductor device wherein air gaps are formed between wirings formed on a semiconductor substrate.

There has heretofore been known a semiconductor device having air gaps provided between wirings with a view toward reducing capacitance between the wirings formed on a semiconductor substrate.

A method of manufacturing the semiconductor device provided with the air gaps includes a step for forming wirings on a first insulating film formed on a semiconductor substrate, so as to adjoin one another, a step for forming a second insulating film on the first insulating film by a plasma CVD method and covering the wirings with the second insulating film such that the air gaps are formed between the adjacent wirings, and a step for forming a third insulating film high in moisture resistance on the second insulating film. Such a configuration has been disclosed in, for example, a patent document 1 (Japanese Unexamined Patent Publication No. Hei 8(1996)-213392).

The patent document 1 discloses that as shown in FIG. 1 and paragraphs 0011 to 0014, top layer wirings 203 are formed on an insulating film 202 formed on a semiconductor substrate 201 so as to adjoin one another, a silicon oxide film 204 is formed on the insulating film 202 by a plasma CVD method and covers the top layer wirings 203 in such a manner that cavity portions 207 are formed between the top layer wirings 203, and a silicon nitride film 205 corresponding to a final protective film is further formed on the silicon oxide film 204.

Since, however, the insulating film for forming the air gaps is formed by the plasma CVD method low in steplike coating property in the conventional configuration referred to above, the flatness of the surface of the insulating film is not satisfactory. Therefore, there is a possibility that the coating property of the insulating film high in moisture resistance, which is formed on the insulating film, will be degraded. Thus, there was a possibility that the moisture resistance of the semiconductor device would be degraded.

SUMMARY OF THE INVENTION

The present invention has been made in view of the foregoing. An object of the present invention is to provide a method for manufacturing a semiconductor device, which enhances the coating property of an insulating film high in moisture resistance, which is formed on an insulating film for forming air gaps and improves moisture resistance of the semiconductor device.

According to one aspect of the present invention, for attaining the above object, there is provided a method for manufacturing a semiconductor device, which comprises steps of forming a plurality of wirings over a first insulating film formed over a semiconductor substrate, so as to adjoin one another, forming a second insulating film over the first insulating film by a plasma CVD method and covering the wirings with the second insulating film in such a manner that air gaps are formed between the respective adjacent wirings, forming a third insulating film over the second insulating film by a high density plasma CVD method, and forming a fourth insulating film higher in moisture resistance than the second and third insulating films over the third insulating film.

According to the above configuration, the coating property of an insulating film high in moisture resistance, which is formed on an insulating film for forming air gaps, can be enhanced, and moisture resistance of a semiconductor device can be improved.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
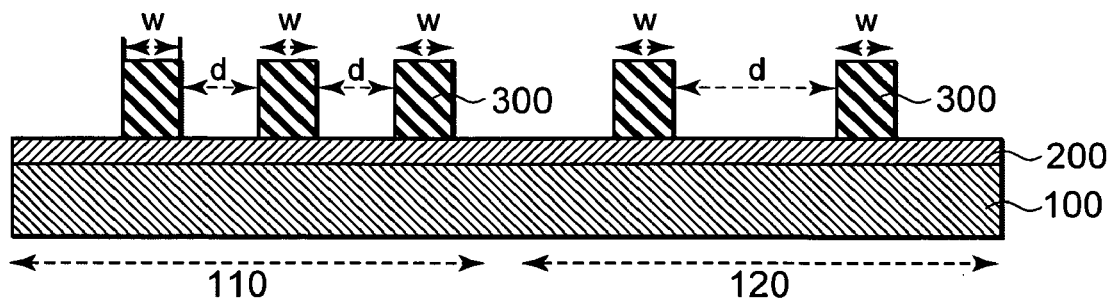
FIG. 1 is a sectional view of a semiconductor device for describing a first embodiment of the present invention.

A preferred embodiment of the invention of the present application will hereinafter be described in detail with reference to the accompanying drawings. Incidentally, similar constituent elements are respectively given similar reference numerals through all drawings.

First Preferred Embodiment

FIGS. 1 through 6 are process diagrams for describing a method for manufacturing a semiconductor device according to a first embodiment of the invention of the present application. Here, FIGS. 1 through 6 are sectional views of the semiconductor device.

In the first embodiment, a plurality of wirings 300 are formed adjacent to one another on a first insulating film 200 formed on a semiconductor substrate 100 as shown in FIG. 1.

The semiconductor substrate 100 is a silicon (Si) substrate. The first insulating film 200 is a silicon oxide ($SiO_2$) film and is formed by a high density plasma CVD (Chemical Vapor Deposition) method. The wirings 300 has a stacked structure in which a titanium nitride (TiN) film, an aluminum-copper (AlCu) film and a titanium nitride (TiN) film are sequentially laminated on one another. The wirings 300 are obtained by stacking the above respective metal films on one another by a sputtering method and patterning the same.

Figure 6:
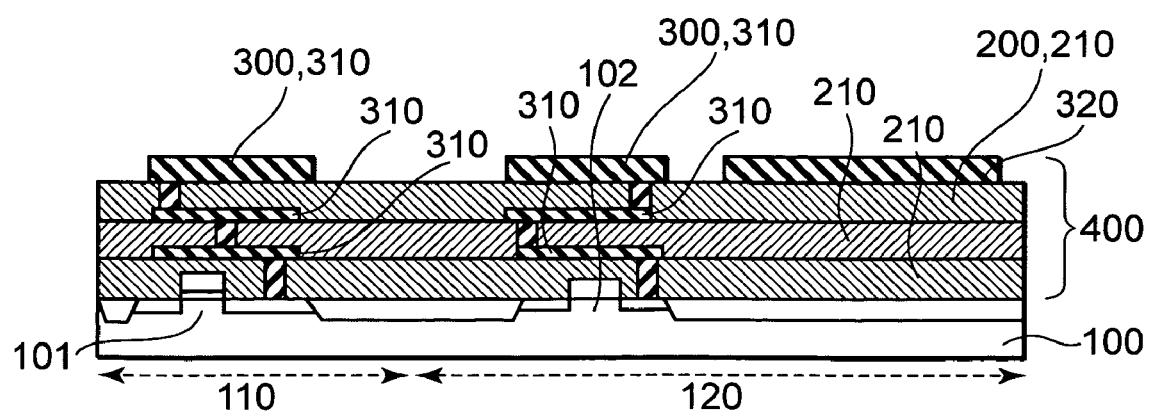
FIG. 6 is a sectional view of the semiconductor device for describing the first embodiment of the present invention.

In the present embodiment, a wiring 300 corresponds to a wiring formed in the top layer of a multilayered wiring layer 400 formed on the semiconductor substrate 100 as shown in FIG. 6.

That is, in the present embodiment, a multilayered wiring layer 400 having interlayer insulating films 210 and wirings 310 both sequentially laminated on one another is formed on the semiconductor substrate 100 formed with electronic elements such as transistors. A first insulating film 200 corresponds to the insulating film 210 equivalent to the top layer of the multilayered wiring layer 400. The wiring 300 corresponds to the wiring 310 corresponding to the top layer of the multilayered wiring layer 400. Incidentally, each electrode pad 320 electrically connected to the outside is formed at the top layer of the multilayered wiring layer 400. Further, the semiconductor device of the present embodiment relates to a semiconductor memory device and includes a memory cell 101 and a bit line which reads out data from the memory cell 101.

In the present embodiment, the semiconductor substrate 100 is divided into a memory cell area 110 formed with the memory cell 101 and a peripheral area 120 formed with a peripheral transistor 102. Each wiring 300 disposed on the memory cell area 110 corresponds to the bit line that reads data from its corresponding memory cell 101. Each wiring 300 disposed on the peripheral area 120 corresponds to other wiring 300.

The wirings 300 disposed on the memory cell area 110 and the peripheral area 120 are disposed with being spaced predetermined intervals from the adjacent wirings as shown in FIG. 1 and extend in their depth directions as viewed in FIG. 1.

Figure 2:
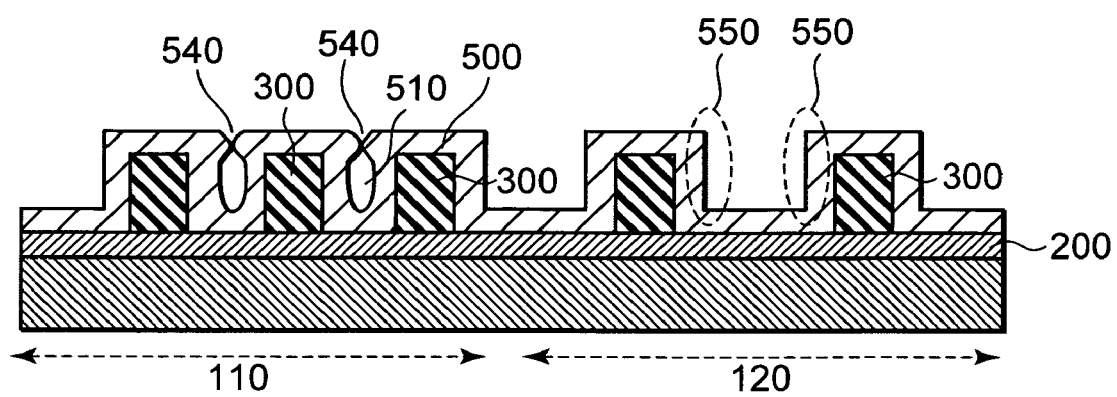
FIG. 2 is a sectional view of the semiconductor device for describing the first embodiment of the present invention.

The wirings 300 disposed in the memory cell area 110 are placed such that their wiring intervals become narrower than those of the wirings 300 disposed on the peripheral area 120. In the present embodiment, the wiring width w of each of the wirings 300 disposed on the memory cell area 110 is 0.376 μm, the wiring interval d between them is 0.264 μm, the wiring width w' of each of the wirings 300 disposed on the peripheral area 120 is 0.80 μm, and the wiring interval d' is 0.80 μm. Next, as shown in FIG. 2, a second insulating film 500 is formed on the first insulating film 200 by a plasma CVD (Chemical Vapor Deposition) method. The wirings 300 are covered with the second insulating film 500 in such a manner that air gaps 510 are formed or defined between the respective adjacent wirings 300.

In the present embodiment, the second insulating film 500 is of a silicon oxide film. The thickness of the second insulating film 500 is 4000 Å. The deposition or growth of the second insulating film by the plasma CVD method is performed under the conditions of the rate of flow of TEOS: 100 sccm, the rate of flow of $O_2$: 1.6 SLM, pressure: 3.0 Torr, high-frequency power: 450 W, low-frequency power: 300 W and deposition temperature: 420° C.

Figure 5:
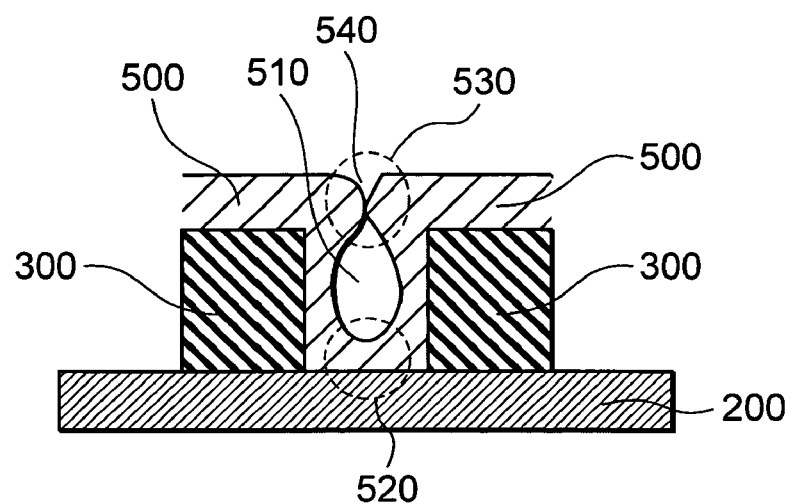
FIG. 5 is a partly enlarged sectional view of the semiconductor device for describing the first embodiment of the present invention.

Upon the above deposition by the plasma CVD method as shown in FIG. 5, the deposition at an upper portion 530 between the wirings is made ahead of other points and the wiring-to-wiring upper portion 530 is blocked off before the second insulating film 500 is sufficiently embedded between the wirings. Thus, the air gap 510 is formed between the wirings at each narrow spot between the wirings. Incidentally, FIG. 5 is equivalent to an enlarged view of each wiring 300 disposed on the memory cell area shown in FIG. 2.

This will be described in further details. The air gap 510 is formed between the wirings 300 upward as viewed from the center. A lower portion 520 located between the wirings and the upper portion 530 are embedded by the second insulating film 500. The side surfaces of the wirings 300 are covered with the second insulating film 500. An upper end of the air gap 510 is located at a level higher than an upper end of each wiring 300.

Since the deposition of the second insulating film 500 proceeds in such a manner that the respective films face each other as viewed from the adjoining wirings 300, each groove 540 is formed at a spot where they intersect. That is, the grooves 540 is defined in the surface of the second insulating film 500 located above the air gap 510. Further, embeddability based on the plasma CVD method depends upon an aspect ratio corresponding to the ratio of a wiring height to the interval between the wirings. At each spot narrow in wiring interval between the wirings 300 and large in aspect ratio, the air gap 510 is formed between the wirings without the second insulating film 500 being sufficiently embedded between the wirings as described above, whereas at a spot wide in wiring interval and low in aspect ratio, the second insulating film 500 is sufficiently embedded between the wirings, and no air gap 510 is formed.

In the present embodiment, as shown in FIG. 2, the air gaps 510 are formed between the respective wirings 300 disposed on the memory cell area 110. The second insulating film 500 is sufficiently embedded between the wirings 300 disposed on the peripheral area 120, and the air gaps 510 are not formed therebetween. In the present embodiment, the aspect ratio of each wiring 300 disposed on the memory cell area 110 is greater than or equal to two, and the aspect ratio of each wiring 300 disposed on the peripheral area 120 is smaller than 2.

Since the second insulating film 500 is formed so as to be recessed between the wirings on the peripheral area 120 here, steps 550 are formed at boundaries between the second insulating film 500 and the wirings 300.

Thus, since the wirings 300 formed on the semiconductor substrate are disposed with the air gaps 510 being respectively interposed therebetween in the invention of the present application, the wiring-to-wiring capacitance can be reduced. That is, since the air gap 510 is lower in dielectric constant than the second insulating film 500, the wiring-to-wiring capacitance can greatly be reduced owing to the provision of the air gaps 510 between the respective wirings, as compared with such a configuration that the second insulating film 500 is fully embedded between the wirings. It is thus possible to greatly enhance the speed of a signal transmitted through each wiring 300.

Since each of the wirings 300 between which the air gaps 510 are formed, corresponds to a bit line for reading data from the corresponding memory cell 101 in the present embodiment in particular, the reading speed of data required to meet its increasing demand in particular can greatly be enhanced. It is thus possible to greatly improve the characteristic as a device. The effect that the invention of the present application is applied can be obtained more noticeably.

It has been obvious that although the thickness of the second insulating film 500 that forms each air gap is 4000 Å as described above in the present embodiment, the air gaps 510 each capable of sufficiently reducing the capacitance between the wirings are formed if the thickness of the second insulating film 500 is 3000 Å or more according to the study of the present inventors.

Further, since the upper end of each air gap 510 is placed at the level higher than the upper end of each wiring 300 as described above in the present embodiment, it is possible to sufficiently reduce the capacitance between the wirings.

Figure 3:
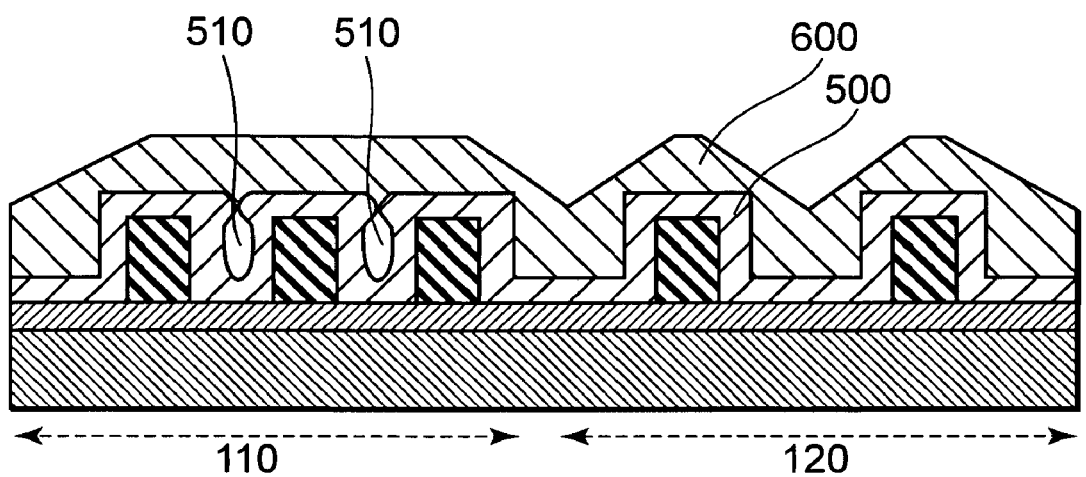
FIG. 3 is a sectional view of the semiconductor device for describing the first embodiment of the present invention.
Figure 4:
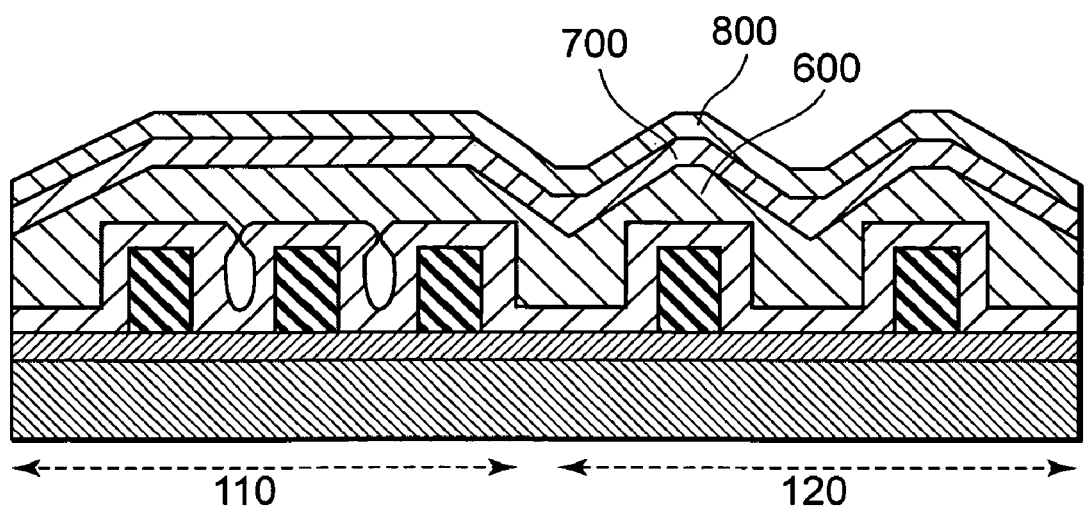
FIG. 4 is a sectional view of the semiconductor device for describing the first embodiment of the present invention.

Next, as shown in FIG. 3, a third insulating film 600 is formed on the second insulating film 500 by a high density plasma CVD (Chemical Vapor Deposition) method.

In the present embodiment, the third insulating film 600 is a silicon oxide film. The thickness of the third insulating film 600 is 8000 Å. The deposition or growth of the third insulating film 600 by the high density plasma CVD method is performed under the conditions of the flow rate of $SiH_4$: 120 sccm, the flow rate of $O_2$: 170 sccm, the flow rate of Ar: 240 sccm, low-frequency power: 4200 W, high-frequency power: 2950 W, and He pressure: 7.0 torr. Since the deposition by the high density plasma CVD method is performed while each deposited film is being chipped away, a film high in flatness can be deposited or grown even when steps exist in a base or underlying layer.

That is, according to this configuration, the grooves 540 formed in the surface of the second insulating film 500, which are located above the air gaps 510, are buried with the third insulating film 600, and the third insulating film 600 high in flatness is grown on the grooves 540. That is, the surface high in flatness can be obtained on the memory cell area 110.

Further, according to this configuration, the third insulating film 600 is formed so as to take a gentle form on each step 550 formed in the second insulating film 500 provided on the peripheral area 120. It is therefore possible to obtain the surface high in flatness even on the peripheral area 120. Next, a fourth insulating film 700 higher in moisture resistance than the second insulating film 500 and the third insulating film 600 is formed on the third insulating film 600.

The fourth insulating film 700 is a passivation film high in moisture resistance, for preventing moisture from being penetrated from outside. In the present embodiment, the fourth insulating film 700 is a silicon nitride (SiN) film. The fourth insulating film 700 is deposited by the plasma CVD method. The thickness of the fourth insulating film 700 is 3000 Å. Incidentally, the fourth insulating film 700 is formed so as to expose each electrode pad 320.

Since the fourth insulating film 700 is deposited on the third insulating film 600 having the surface high in flatness as described above in the invention of the present application, the coating property of the deposited fourth insulating film 700 is enhanced. Thus, the fourth insulating film 700 can sufficiently prevent penetration of moisture or the like from outside, and the moisture resistance of the semiconductor device can be enhanced. Further, a fifth insulating film 800 is formed on the fourth insulating film 700 in the present embodiment.

The fifth insulating film 800 is a silicon oxide film and is deposited by the plasma CVD method. The thickness of the fifth insulating film 800 is 6000 Å. Incidentally, the fifth insulating film 800 is formed so as to expose each electrode pad 320.

While the preferred form of the present invention has been described, it is to be understood that modifications will be apparent to those skilled in the art without departing from the spirit of the invention. The scope of the invention is to be determined solely by the following claims.

What is claimed is:

1. A method for manufacturing a semiconductor memory device, comprising the following steps of:
    forming a memory cell area including at least one memory cell, and a peripheral area including at least one peripheral transistor, in a semiconductor substrate;
    forming a first insulating film over the semiconductor substrate;
    forming a plurality of wirings over the first insulating film so as to adjoin one another, a distance between the wirings in the memory cell area being smaller than a distance between the wirings in the peripheral area;
    forming a second insulating film over the first insulating film by a plasma CVD method and covering the wirings with the second insulating film to form air gaps between the respective adjacent wirings disposed only over the memory cell area;
    forming a third insulating film over the second insulating film by a high density plasma CVD method; and
    forming a fourth insulating film higher in moisture resistance than the second and third insulating films over the third insulating film.

2. The method according to claim 1, wherein a multilayered wiring layer is formed over the semiconductor substrate, and the wirings are part of the multilayered wiring layer and wirings each corresponding to a top layer of the multilayered wiring layer.

3. The method according to claim 1, wherein the second insulating film is a silicon oxide film.

4. The method according to claim 1, wherein the thickness of the second insulating film is 3000 Å or more.

5. The method according to claim 1, wherein the third insulating film is a silicon oxide film.

6. The method according claim 1, wherein the fourth insulating film is a silicon nitride film.

7. The method according to claim 1, wherein the semiconductor memory device includes bit lines each reading data from the memory cell, and the wirings correspond to the bit lines.

8. The method according to claim 2, wherein the second insulating film is a silicon oxide film.

9. The method according to claim 2, wherein the thickness of the second insulating film is 3000 Å or more.

10. The method according to claim 3, wherein the thickness of the second insulating film is 3000 Å or more.

11. The method according to claim 8, wherein the thickness of the second insulating film is 3000 Å or more.

12. The method according to claim 1, wherein the air gaps are sealed beneath the third insulating film and the fourth insulating film.

13. The method according to claim 1, wherein the air gaps reduce capacitance between adjacent wirings.

14. The method according to claim 1, wherein the second insulating film individually surrounds each of the air gaps.

* * * * *